United States Patent
Tam et al.

(10) Patent No.: US 11,277,097 B1
(45) Date of Patent: Mar. 15, 2022

(54) OPEN-LOOP ADAPTIVE BIAS POWER AMPLIFIER

(71) Applicant: MARVELL ASIA PTE, LTD., Singapore (SG)

(72) Inventors: Sai-Wang Tam, Sunnyvale, CA (US);
Alden C Wong, Sunnyvale, CA (US);
Ovidiu Carnu, Scotts Valley, CA (US);
Randy Tsang, San Carlos, CA (US)

(73) Assignee: MARVELL ASIA PTE LTD, Singapore (SG)

(*) Notice: Subject to any disclaimer, the term of this patent is extended or adjusted under 35 U.S.C. 154(b) by 119 days.

(21) Appl. No.: 16/867,600

(22) Filed: May 6, 2020

Related U.S. Application Data

(60) Provisional application No. 62/850,970, filed on May 21, 2019.

(51) Int. Cl.
| | | |
|---|---|---|
| H03G 3/30 | (2006.01) | |
| H03F 1/02 | (2006.01) | |
| H03F 3/21 | (2006.01) | |
| H03F 3/45 | (2006.01) | |

(52) U.S. Cl.
CPC ........... *H03F 1/0211* (2013.01); *H03F 3/21* (2013.01); *H03F 3/45183* (2013.01); *H03G 3/3042* (2013.01); *H03F 2200/09* (2013.01); *H03F 2200/451* (2013.01); *H03G 2201/103* (2013.01); *H03G 2201/307* (2013.01)

(58) Field of Classification Search
CPC .... H03F 1/30; H03F 1/32; H03F 3/04; H03G 2201/40
USPC ............................................. 330/285; 333/14
See application file for complete search history.

(56) References Cited

U.S. PATENT DOCUMENTS

| | | |
|---|---|---|
| 9,385,666 B2 | 7/2016 | Tam et al. |
| 2017/0163216 A1* | 6/2017 | Li ............................ H03F 3/19 |

OTHER PUBLICATIONS

Chen et al., "A 2×2 MIMO 802.11 abgn/ac WLAN SoC with integrated T/R switch and on-chip PA delivering VHT80 256QAM 17.5dBm in 55nm CMOS,", RMO4A-5, IEEE Radio Frequency Integrated Circuits Symposium, pp. 225-228, year 2014.

* cited by examiner

*Primary Examiner* — Steven J Mottola

(57) ABSTRACT

A power amplification system includes a Power Amplifier (PA) for amplifying an input RF signal. An adaptive bias circuit is configured to adaptively set a bias of the PA. The adaptive biasing circuit includes a gain expansion circuit, a gain compression circuit and a biasing circuit. The gain expansion circuit derives a gain-expansion control signal from the input RF signal. For a first sub-range of the input RF signal, the gain-expansion control signal has a larger dynamic range than the input RF signal. The gain compression circuit derives a gain-compression control signal from the input RF signal. For a second sub-range of the input RF signal having higher power levels than the first sub-range, the gain-compression control signal has a smaller dynamic range than the input RF signal. The biasing circuit sets the bias of the PA responsively to the gain-expansion control signal and the gain-compression control signal.

16 Claims, 6 Drawing Sheets

OPEN-LOOP ADAPTIVE BIAS POWER AMPLIFIER

CROSS-REFERENCE TO RELATED APPLICATIONS

This application claims the benefit of U.S. Provisional Patent Application 62/850,970, filed May 21, 2019, whose disclosure is incorporated herein by reference.

FIELD OF THE DISCLOSURE

The present disclosure relates generally to power amplification, and particularly to adaptive bias Power Amplifiers (PAs).

BACKGROUND

Various techniques for linearization of Power Amplifiers (PAs) are known in the art. For example, in an article entitled "A 2×2 MIMO 802.11 abgn/ac WLAN SoC with integrated T/R switch and on-chip PA delivering VHT80 256QAM 17.5 dBm in 55 nm CMOS," 2014 IEEE Radio Frequency Integrated Circuits Symposium, Tampa, Fla., July, 2014, Chen et al. describe a PA linearization scheme for a PA that operates in Class-AB mode, including a PA bias circuit that is designed to adaptively track the peak amplitude of the PA input signal and boost the PA bias voltage.

As another example, U.S. Pat. No. 9,385,666 describes a PA with wideband AM-AM feedback and digital pre-distortion. In some embodiments, a system includes an amplifier circuit configured to amplify an input and generate an output, a bias circuit configured to bias the amplifier circuit, and a feedback circuit configured to generate feedback based on the input and the output, and to adjust the bias of the amplifier circuit based on the feedback to reduce amplitude nonlinearity in the output. A digital pre-distortion circuit is configured to reduce phase nonlinearity in the output.

The description above is presented as a general overview of related art in this field and should not be construed as an admission that any of the information it contains constitutes prior art against the present patent application.

SUMMARY

An embodiment that is described herein provides a power amplification system including a Power Amplifier (PA) configured to amplify an input Radio Frequency (RF) signal, and an adaptive bias circuit configured to adaptively set a bias of the PA. The adaptive biasing circuit includes a gain expansion circuit, a gain compression circuit and a biasing circuit. The gain expansion circuit is configured to derive a gain-expansion control signal from the input RF signal, wherein, for a first sub-range of power levels of the input RF signal, the gain-expansion control signal has a larger dynamic range than the input RF signal. The gain compression circuit is configured to derive a gain-compression control signal from the input RF signal, wherein, for a second sub-range of power levels of the input RF signal having higher power levels than the first sub-range, the gain-compression control signal has a smaller dynamic range than the input RF signal. The biasing circuit is configured to set the bias of the PA responsively to the gain-expansion control signal and the gain-compression control signal.

In some embodiments, the biasing circuit is configured to sum the gain-expansion control signal and the gain-compression control signal, and to set the bias of the PA responsively to the sum. In an embodiment, the PA includes a differential PA, and the biasing circuit is configured to set the bias of the PA by setting a common-mode level for the input RF signal.

In a disclosed embodiment, the gain expansion circuit and the gain compression circuit include respective trans-conductance amplifiers. In an example embodiment, the gain expansion circuit includes a P-type metal-oxide-semiconductor (PMOS) based amplifier configured to output the gain-expansion control signal, and the gain compression circuit includes an N-type metal-oxide-semiconductor (NMOS) based amplifier configured to output the gain-compression control signal. In an embodiment, the biasing circuit is configured to bias the PA with a quiescent bias that causes the PA to operate in class-AB.

In some embodiments, the power amplification system further includes an output balanced-to-unbalanced (BALUN) transformer for coupling an output of the PA to a load, and the BALUN transformer is configurable to operate in a first mode having a first coupling ratio, and in a second mode having a second coupling ratio higher than the first coupling ratio. In an embodiment, the power amplification system further includes a controller that is configured to set the BALUN transformer to the first mode for a first output power setting of the PA, and to the second mode for a second output power setting of the PA, higher than the first output power setting.

Typically, the adaptive bias circuit is configured to set the bias of the PA in open-loop, irrespective of an output of the PA.

There is additionally provided, in accordance with an embodiment that is described herein, a power amplification method. The method includes amplifying an input Radio Frequency (RF) signal using a Power Amplifier (PA). A bias of the PA is adaptively set, by deriving a gain-expansion control signal from the input RF signal, wherein, for a first sub-range of power levels of the input RF signal, the gain-expansion control signal has a larger dynamic range than the input RF signal, deriving a gain-compression control signal from the input RF signal, wherein, for a second sub-range of power levels of the input RF signal having higher power levels than the first sub-range, the gain-compression control signal has a smaller dynamic range than the input RF signal, and setting the bias of the PA responsively to the gain-expansion control signal and the gain-compression control signal.

The present disclosure will be more fully understood from the following detailed description of the embodiments thereof, taken together with the drawings in which:

DETAILED DESCRIPTION OF EMBODIMENTS

Figure 1:
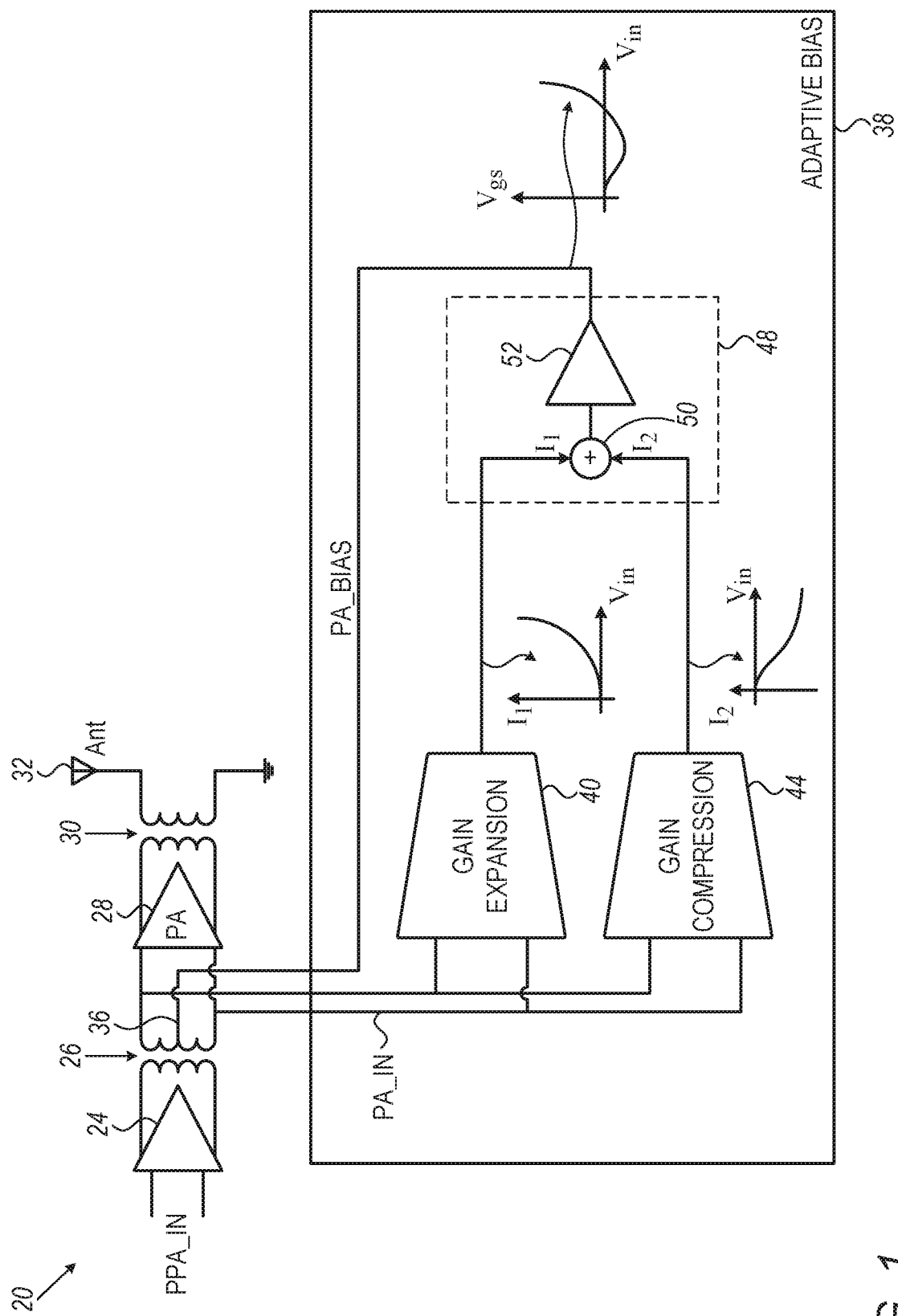
FIG. 1 is a block diagram that schematically illustrates a power amplification system that uses open-loop adaptive PA biasing, in accordance with an embodiment that is described herein.

Power Amplifiers (PAs) of modern communication devices, e.g., Wireless Local-Area Network (WLAN) devices, are typically required to provide high linearity and high efficiency over a large bandwidth. These requirements tend to contradict one another and are therefore difficult to optimize simultaneously. For example, in order to increase efficiency it is desirable to operate the PA close to saturation, and/or to operate the PA in Class-AB. Such operating point, however, is usually poor in linearity. Various feedback-based linearization schemes can be used for improving the PA linearity and efficiency. Such techniques, however, are usually limited to a small bandwidth.

Embodiments that are described herein provide improved methods and systems for PA linearization, which improve both linearity and efficiency over a large bandwidth. The disclosed techniques apply adaptive bias to the PA in open-loop, depending on the input Radio Frequency (RF) signal provided to the PA.

In some embodiments, a power amplification system comprises a PA that operates in Class-AB, and an adaptive bias circuit configured to adaptively set a bias of the PA as a function of the input RF signal. In Class-AB operation, the PA typically exhibits gain expansion at medium output power levels, and gain compression at high output power levels. To counteract these gain characteristics, the adaptive biasing circuit comprises a gain expansion circuit configured to expand the gain of the PA at high output power levels, and a gain compression circuit configured to compress the gain of the PA at medium output power levels.

In an example embodiment, the gain expansion circuit is configured to derive a gain-expansion control signal from the input RF signal at high output power levels, and the gain compression circuit is configured to derive a gain-compression control signal from the input RF signal at medium output power levels. A bias circuit is configured to set the bias of the PA responsively to the gain-expansion control signal and the gain-compression control signal.

In one example implementation, the gain expansion and gain-compression circuits comprise respective trans-conductance amplifiers, and the gain-expansion and gain-compression control signal comprise respective currents. The bias circuit in this implementation is configured to sum the two currents, to generate a quiescent current that operates the PA in Class-AB, and to set the bias of the PA as a function of the sum of the three currents.

The disclosed biasing technique depends entirely on the input RF signal, i.e., does not require any form of feedback from the output of the PA. As such, the disclosed technique is simple to implement, unconditionally stable, highly broadband, and is not impaired by PA memory effects. In some embodiments, the open-loop PA bias can be calibrated to account for Process-Voltage-Temperature (PVT) variations.

In some embodiments, the power amplification system further applies configurable impedance matching depending on output power level. An example implementation, which uses an output balanced-to-unbalanced (BALUN) transformer having a switchable coupling ratio, is described herein.

Example test results, which demonstrate the achievable performance of the disclosed techniques, are given in U.S. Provisional Patent Application 62/850,970, cited above and incorporated herein by reference.

FIG. 1 is a block diagram that schematically illustrates a power amplification system 20 that uses open-loop adaptive PA biasing, in accordance with an embodiment that is described herein. In the present example, system 20 is used for amplifying a Wireless Local Area Network (WLAN) signal in the 2.4 GHz frequency band, e.g., in a WLAN Access Point (AP) or client station (STA). Alternatively, however, a system of this sort is applicable in various other frequency ranges, applications and equipment types, e.g., in Bluetooth or cellular communication devices.

In the embodiment of FIG. 1, system 20 comprises an amplification chain that comprises a Pre-Power-Amplifier (PPA) 24, an input transformer 26, a Power Amplifier (PA) 28 and an output transformer 30. The amplification chain, including PPA 24 and PA 28, is differential, and transformer 30 comprises a BALanced-to-UNbalanced (BALUN) transformer.

PPA 24 is driven with a Radio Frequency (RF) signal denoted "PPA_IN". In the present example, the PPA_IN signal comprises a modulated WLAN signal, e.g., a signal having a bandwidth of 40 MHz in the 2.4 GHz band. Alternatively, other suitable bandwidths (e.g., 80 MHz) and other suitable bands (e.g., 5 GHz) can be used. PPA 24 amplifies the PPA_IN signal so as to produce a RF signal denoted "PA_IN". PA 28 amplifies the PA_IN signal. The amplified signal is delivered from the output of PA 28, via transformer 30, to a load. In the present example the load comprises an antenna 32.

In the present example, the quiescent bias current of PA 28 (i.e., the bias current in the absence of input signal) is set so that PA 28 operates in Class-AB. In Class-AB operation, the gain of PA 28 is non-linear across most of the dynamic range of the PA. At high output power levels, PA 28 gradually enters saturation and thus exhibits gain compression (i.e., the range of output power levels is smaller than the corresponding range of input power levels). At medium output power levels, PA 28 exhibits gain expansion (i.e., the range of output power levels is larger than the corresponding range of input power levels). Example numerical ranges for "high output power levels" and "medium output power levels" are given below.

In some embodiments, system 20 further comprises an adaptive bias circuit 38 that is configured to produce an adaptive bias voltage (labeled "PA_BIAS" in the figure, and also denoted Vgs) for biasing PA 28. As seen in FIG. 1, the adaptive bias voltage is provided to a center tap 36 of input transformer 26. Adaptive bias circuit 38 sets Vgs as a function of the RF signal at the input of the PA (PA_IN), in a manner that compensates for the above-described gain expansion and compression characteristics of the PA.

In an embodiment, adaptive bias circuit 38 comprises a gain expansion circuit 40 and a gain compression circuit 44. Gain expansion circuit 40 is configured to derive a gain-expansion control signal from the PA_IN signal. Gain expansion means that, for a predefined sub-range of medium power levels of the PA_IN signal, the gain-expansion control signal has a larger dynamic range than the PA_IN signal. Gain compression circuit 44 is configured to derive a gain-compression control signal from the PA_IN signal. Gain compression means that, for a predefined sub-range of high power levels of the PA_IN signal (the sub-range of high power levels being higher than the sub-range of medium power levels), the gain-compression control signal has a smaller dynamic range than the PA_IN signal. Adaptive bias circuit 38 further comprises a biasing circuit 48, which is configured to set the bias of PA 28 (PA_BIAS) based on the gain-expansion control signal and the gain-compression control signal.

In some embodiments, the saturated output power of PA 28 is approximately 28 dBm, the sub-range of high power levels (in which adaptive biasing circuit 38 applies gain expansion) is defined approximately in the output power interval 25-28 dBm, and the sub-range of medium power levels (in which adaptive biasing circuit 38 applies gain compression) is defined approximately in the output power interval 15-25 dBm. The gain expansion operation increases the PA saturation power, and generally linearizes the PA response at the high output power levels. The gain compression operation linearizes the PA response at the medium output power levels.

Figure 2:
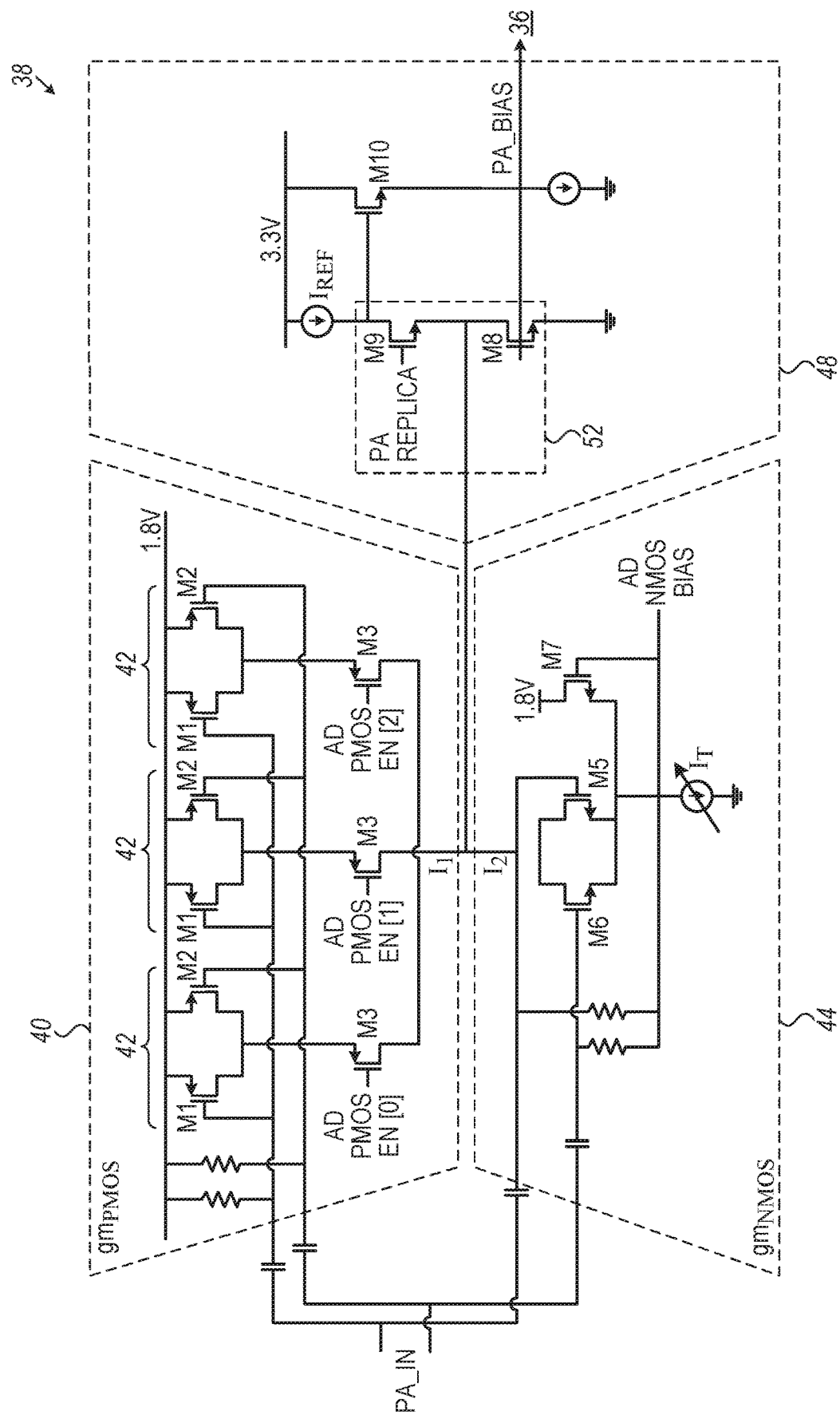
FIG. 2 is a circuit diagram of an adaptive biasing circuit in the system of FIG. 1, in accordance with an embodiment that is described herein.

In the present example, the RF input signal PA_IN is a voltage signal, and gain expansion circuit 40 and gain compression circuits 44 comprise trans-conductance amplifiers. An example implementation of these trans-conductance amplifiers is shown in FIG. 2 below. When using trans-conductance amplifiers, the gain-expansion control signal produced by gain expansion circuit 40 is a current signal denoted I1, and the gain-compression control signal produced by gain compression circuit 44 is a current signal denoted I2.

A graph next to gain expansion circuit 40 in FIG. 1 illustrates the input-voltage-to-output-current characteristic of circuit 40. In other words, this graph illustrates the gain-expansion control signal I1 as a function of PA_IN. A graph next to gain compression circuit 44 illustrates the input-voltage-to-output-current characteristic of circuit 44. This graph illustrates the gain-compression control signal I2 as a function of PA_IN.

In an embodiment, bias circuit 48 comprises a combiner 50 that sums I1 and I2, and an amplifier 52 (also referred to as a "PA replica amplifier") that outputs the voltage Vgs as a function of the current I1+I2. The Vgs voltage is provided as the PA_BIAS signal at center tap 36 of input transformer 26. Typically, amplifier 52 also produces the quiescent current for operating PA 28 in Class-AB. Typically, amplifier 52 is implemented similarly to a half-cell of PA 28, with a proportionate scaling in size, hence the name "replica amplifier."

FIG. 2 is a circuit diagram of adaptive biasing circuit 38 of system 20, in accordance with an embodiment that is described herein. In the embodiment of FIG. 2, gain expansion circuit 40 comprises a P-type metal-oxide-semiconductor (PMOS) based trans-conductance amplifier, also referred to as gmPMOS. Gain compression circuit 44 comprises an N-type metal-oxide-semiconductor (NMOS) based trans-conductance amplifier, also referred to as gmNMOS.

In some embodiments, gain expansion circuit 40 comprises multiple gain expansion stages 42 (in the present example three stages) connected in parallel. Each stage 42 comprises two PMOS transistors denoted M1 and M2, which are connected in a differential-pair configuration. Transistors M1 and M2 are biased in Class C, e.g., with Vgs=0V. The gates of transistors M1 and M2 are connected respectively to the two inputs that provide the differential input signal PA_IN. Each gain expansion stage 42 further comprises a third PMOS transistor denoted M3, which is connected in series with the differential pair (M1 and M2).

The gate of M3 in each stage is enabled or disables individually by a respective control signal denoted AD_PMOS_EN. The output current of gain expansion circuit 40 (I1) is taken from the drain of M7.

In an embodiment, when the bias of PA 28 is high, the PA is biased to operate in Class-A, in which case the gain expansion is relatively small. Under these circumstances, only one or two stages 42 are enabled. On the other hand, when the bias of PA 28 is low, the PA is biased to operate in deep Class-AB, and the gain expansion is large. Under these circumstances, all stages 42 are enabled. Alternatively, stages 42 may be enabled or disabled in any other suitable manner.

In each gain expansion stage 42, the differential pair M1 and M2 serves as an envelope detector: When the envelope of PA_IN (denoted $|V_{diff\_in}|$) is smaller than the PMOS threshold voltage $V_{Th\_PMOS}$, the differential pair M1 and M2 is OFF, i.e., in cutoff, and does not conduct current. As a result, the current flowing through the entire stage 42 is virtually zero. When the envelope of PA_IN is larger than the PMOS threshold voltage, i.e., when $|V_{diff\_in}|>V_{Th\_PMOS}$, the differential pair M1 and M2 is ON, i.e., in saturation, and exhibits some minimal resistance. As a result, the current flowing through stage 42 follows the current-voltage (I-V) characteristic of M3, which is approximately proportional to $|V_{diff\_in}|^2$.

In total, the current at the output of gain expansion circuit 40 (I1) is zero for $|V_{diff\_in}|<V_{Th\_PMOS}$, and $\propto N \cdot |V_{diff\_in}|^2$ for $|V_{diff\_in}|>V_{Th\_PMOS}$, wherein N denotes the number of active gain expansion stages 42. This dependence provides the gain expansion curve of I1 (FIG. 1). This curve is also depicted on the left-hand side of FIG. 4 below.

In some embodiments, gain compression circuit 44 comprises three NMOS transistors denoted M5, M6 and M7. All three transistors are biased to operate in Class-AB. Transistors M5 and M6 are connected in a differential pair configuration, and function as an envelope detector. The gates of M5 and M6 are connected respectively to the two inputs that provide the differential input signal PA_IN. M3 is provided with a constant bias denoted AD_NMOS_BIAS or $V_{bias}$. A current source denoted IT produces a current denoted $I_{tail}$ between the sources of M5 and M6 and ground. The output current of gain compression circuit 44 (I2) is taken from the drains of M5 and M6. Typically, current IT produced by current source $I_{tail}$ is constant. The constant value of $I_{tail}$ can be programmed or otherwise set, e.g., for controlling the amount of gain compression being applied.

In this configuration, gain compression circuit 44 functions as a differential difference amplifier with a variable tail bias current source. When $|V_{diff\_in}|<V_{bias}$, M7 is ON, and M5 and M6 are both OFF. As a result, I2 is virtually zero. When $|V_{diff\_in}|>V_{bias}$ and I2<$I_{tail}$, M5, M6 and M7 are all ON, and the output current I2 is given by I2≈k·$|V_{diff\_in}|$, wherein k is a predefined negative constant. When $|V_{diff\_in}|>V_{bias}$ and I2=$I_{tail}$, M7 is OFF, and M5 and M6 are both ON. As a result, I2=$I_{tail}$. The resulting current at the output of gain compression circuit 44 (I2) approximates the gain compression curve of I2 (FIG. 1). This curve is also depicted in the top middle of FIG. 4 below.

In the embodiment of FIG. 2, PA replica amplifier 52 in bias circuit 48 comprises two NMOS transistors denoted M8 and M9. The input to PA replica amplifier 52 is a sum of I1 and I2, produced by gain expansion (gmPMOS) circuit 40 and gain compression (gmNMOS) circuit 44, respectively. Additionally, bias circuit 48 comprises a current source denoted $I_{REF}$, which produces the quiescent bias current for PA 28, and an NMOS transistor M10. Operation of bias circuit 48 in conjunction with PA 28 is addressed in FIG. 3 below.

Figure 3:
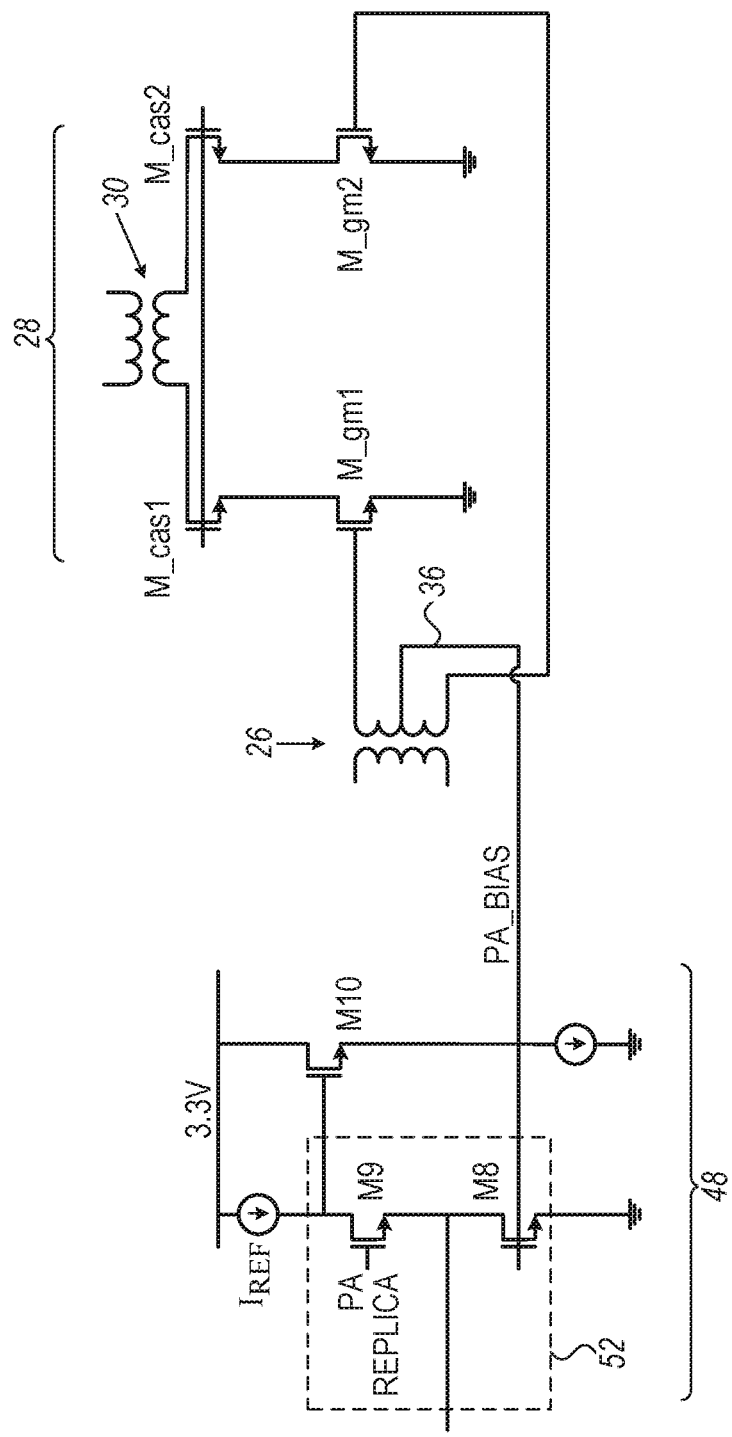
FIG. 3 is a circuit diagram of a bias circuit and a PA in the system of FIG. 1, in accordance with an embodiment that is described herein.

FIG. 3 is a circuit diagram of bias circuit 48 and PA 28 of system 20, in accordance with an example embodiment that is described herein. In this example, PA 28 is a differential cascode amplifier. The differential cascode amplifier comprises a common-source stage (made of two NMOS transistors denoted M_gm1 and M_gm2) that feeds a common-gate stage (made of two NMOS transistors denoted M_cas1 and M_cas2). In bias circuit 48, transistors M8 and M9 function as a replica of transistors M_gm1 and Mcas1 of PA 28.

Transistors M8, M9 and M10 also function as a wideband source follower. Current source $I_{REF}$ produces a quiescent bias current for PA 28, in the present example causing PA 28 to operate in deep Class-AB.

Figure 4:
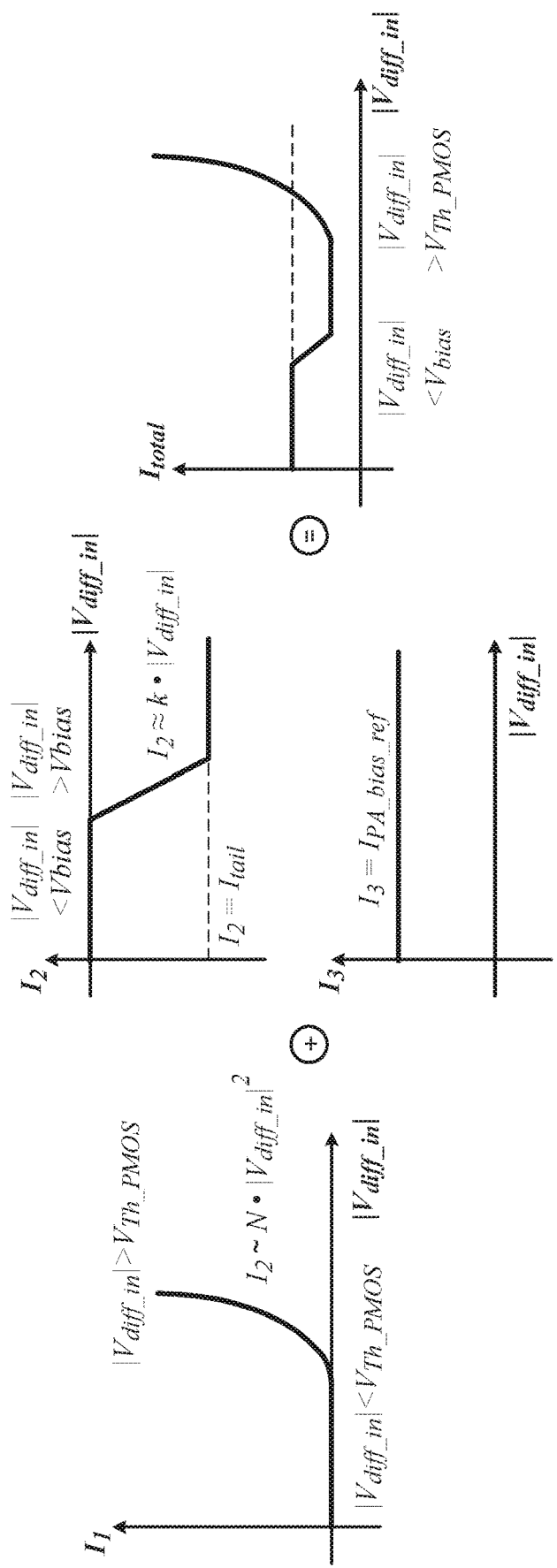
FIG. 4 is a diagram showing simulated currents used in adaptive PA biasing in the system of FIG. 1, in accordance with an embodiment that is described herein.

FIG. 4 is a diagram showing simulated currents produced in adaptive bias circuit 38, in accordance with an embodiment that is described herein. The notation used in FIG. 4 is the same as in the descriptions of circuits 40, 44 and 48 of FIG. 2 above.

A graph on the left-hand side of the figure shows I1 (an example of a gain-expansion control signal produced by gain expansion circuit 40) as a function of $|V_{diff\_in}|$ (the amplitude of the input RF signal to PA 28). A graph at the top-middle of the figure shows I2 (an example of a gain-compression control signal produced by gain compression circuit 44) as a function of $|V_{diff\_in}|$. A graph on the bottom-middle of the figure shows I3 produced by current source $I_{REF}$ in biasing circuit 48 (the quiescent bias current of PA 28, denoted $I_{PA\_bias\_ref}$). In the present example the quiescent current is constant, e.g., does not vary with $|V_{diff\_in}|$.

A graph on the right-hand side of the figure shows the total bias current $I_{total}$, which is the sum of I1+I2+I3, as a function of $|V_{diff\_in}|$. As seen, $I_{total}$ applies gain compression at medium power levels ($V_{bias} < |V_{diff\_in}| < V_{Th\_PMOS}$) and applies gain expansion at high power levels ($|V_{diff\_in}| > V_{Th\_PMOS}$).

Figure 5:
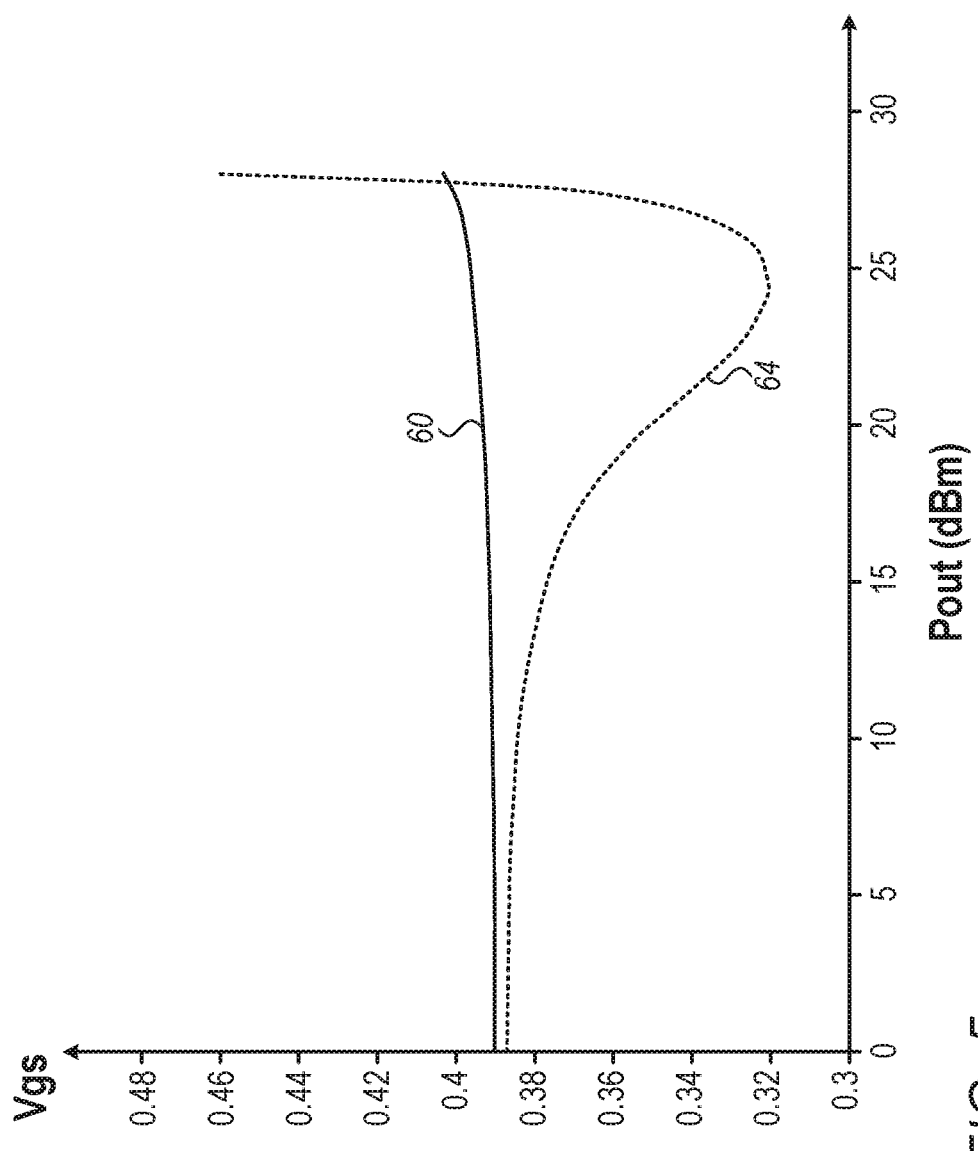
FIG. 5 is a graph showing a simulated bias voltage for the PA in the system of FIG. 1, in accordance with an embodiment that is described herein.

FIG. 5 is a graph showing a simulated bias voltage for PA 28, in accordance with an embodiment that is described herein. The horizontal axis gives the output power $P_{out}$ of PA 28, in dBm. The vertical axis gives the bias voltage $v_{gs}$ applied to PA 28, in Volts. A plot 60 shows $v_{gs}$ without any adaptive biasing, as a reference. A plot 64 shows $v_{gs}$ as a function of output power, with adaptive biasing in accordance with the disclosed techniques (e.g., PA_BIAS of FIGS. 1 and 2). As seen, PA_BIAS exhibits gain compression at medium output power levels (in the present example approximately between 10-24 dBm) and gain expansion at high output power levels (in the present example above approximately 24 dBm).

Figure 6:
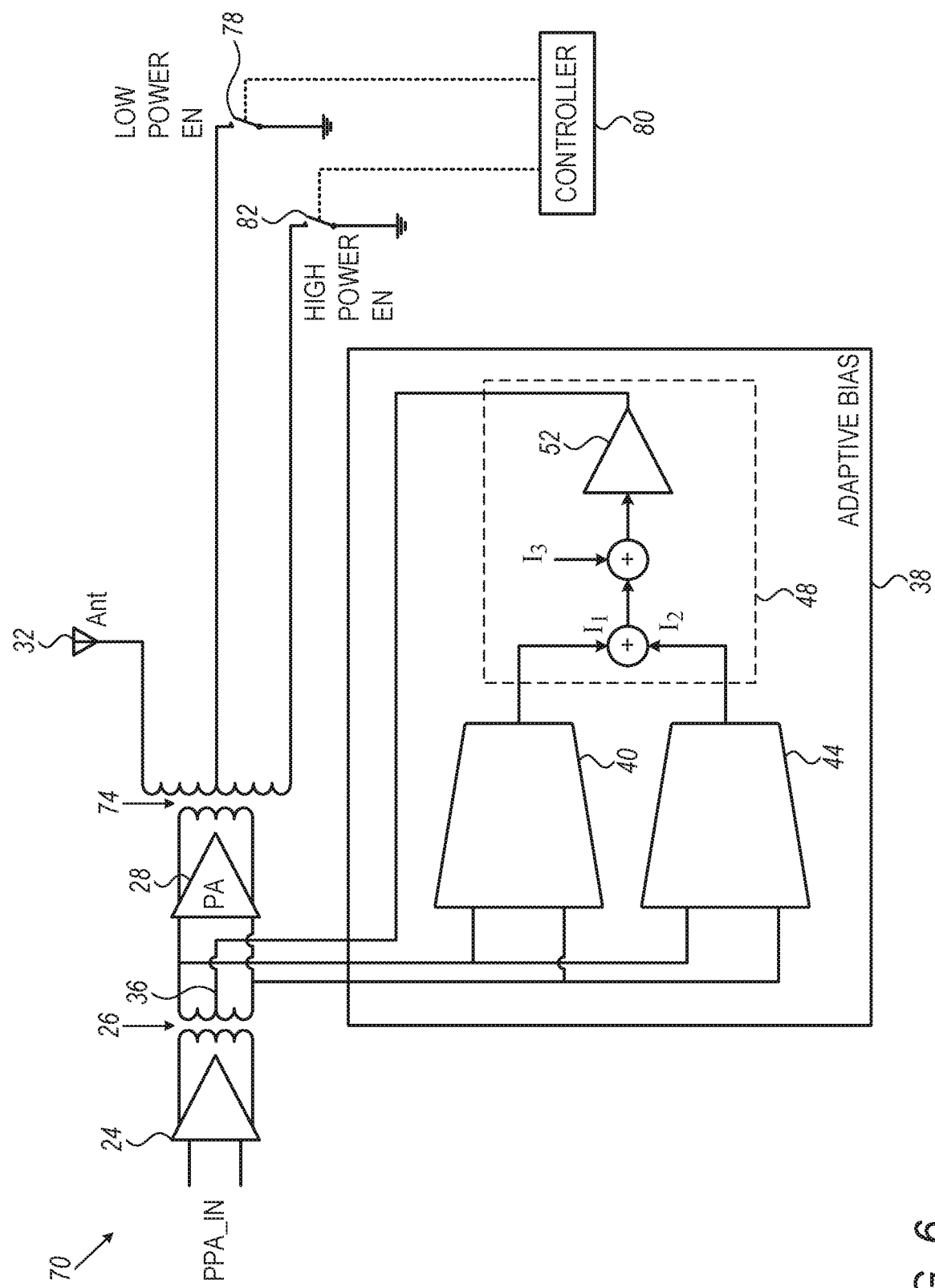
FIG. 6 is a block diagram that schematically illustrates a power amplification system that uses combined adaptive PA biasing and load impedance matching, in accordance with an embodiment that is described herein.

FIG. 6 is a block diagram that schematically illustrates a power amplification system 70 that uses combined adaptive PA biasing and load impedance matching, in accordance with an embodiment that is described herein. System 70 performs adaptive biasing of PA 28 similarly to system 20 of FIG. 1. In addition, system 70 modifies the impedance matching between the output of PA 28 and the input of antenna 32, depending on the output power of PA 28.

In the embodiment of FIG. 6, system 70 comprises a BALanced-to-UNbalanced (BALUN) transformer 74 having multiple output taps, in the present example three output taps. One output tap is connected to antenna 32. The other two output taps are connected to ground via two RF switches 78 and 82 denoted "HIGH POWER ENABLE" and "LOW POWER ENABLE", respectively. A controller 80 controls switches 78 and 82.

In an embodiment, when the output power of PA 28 is below a predefined power threshold, controller 80 closes switch 78 and opens switch 82. When the output power of PA 28 is above the predefined power threshold, controller 80 closes switch 82 and opens switch 78. In this manner, controller 80 switches between two modes of operation. In the first mode (a low-power output-power setting in which switch 78 is closed and switch 82 is open) BALUN transformer 74 has a certain coupling ratio between its primary and secondary coils. In the second mode (a high-power output-power setting in which switch 82 is closed and switch 78 is open) BALUN transformer 74 has a higher coupling ratio that in the low-power mode.

In some embodiments, PA 28 comprises multiple power amplification stages that are connected in parallel and can be enabled and disabled individually by controller 80. In an embodiment, controller 80 activates a certain number of power amplification stages (e.g., all stages) in the high-power mode (i.e., when switch 82 is closed and switch 78 is open), and a smaller number of power amplification stages in the low-power mode (i.e., when switch 78 is closed and switch 82 is open).

In one example implementation, BALUN transformer 70 has a coupling ratio of 1:2 in the low-power mode, and a coupling ratio of 3:2 in the high-power mode. In another embodiment, BALUN transformer 70 has a coupling ratio of 2:2 in the low-power mode. PA 28 has a total of four parallel amplification stages. In the high-power mode, controller 80 activates all four amplification stages of the PA, and in the low-power mode activates only a single amplification stage. Alternatively, any other suitable values can be used. In an example embodiment, the output impedance of PA 28 is 22.2Ω in the high-power mode, and 50Ω in the low-power mode. Alternatively, any other suitable values can be used.

By combining adaptive PA biasing with the above-described impedance matching scheme, both PA efficiency and signal purity (e.g., Error Vector Magnitude—EVM) can be improved. Example test results can be found in U.S. Provisional Patent Application 62/850,970, cited above and incorporated herein by reference.

The configurations of systems 20 and 70 and their various components, such the internal structure of adaptive bias circuit 38, gain expansion circuit 40, gain compression circuit 44 and biasing circuit 48, as shown in FIGS. 1-3 and 6, are example configurations that are depicted solely for the sake of clarity. In alternative embodiments, any other suitable configurations can be used. Elements that are not mandatory for understanding of the disclosed techniques have been omitted from the figure for the sake of clarity.

The different elements of systems 20 and 70 and their various components may be implemented using any suitable hardware, such as using discrete components and/or one or more RF Integrated Circuits (RFICs). Some system elements, e.g., controller 80, may be implemented, entirely or in part, using suitable software or firmware, for example.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A power amplification system, comprising:
   a differential Power Amplifier (PA), configured to amplify an input Radio Frequency (RF) signal; and
   an adaptive bias circuit configured to adaptively set a bias of the PA, the adaptive biasing circuit comprising:
      a gain expansion circuit, configured to derive a gain-expansion control signal from the input RF signal, wherein, for a first sub-range of power levels of the input RF signal, the gain-expansion control signal has a larger dynamic range than the input RF signal;
      a gain compression circuit, configured to derive a gain-compression control signal from the input RF signal, wherein, for a second sub-range of power levels of the input RF signal having higher power levels than the first sub-range, the gain-compression control signal has a smaller dynamic range than the input RF signal; and
      a biasing circuit, configured to set the bias of the PA responsively to the gain-expansion control signal and the gain-compression control signal, by setting a common-mode level for the input RF signal.

2. The power amplification system according to claim 1, wherein the biasing circuit is configured to sum the gain-expansion control signal and the gain-compression control signal, and to set the bias of the PA responsively to the sum.

3. The power amplification system according to claim 1, wherein the gain expansion circuit and the gain compression circuit comprise respective trans-conductance amplifiers.

4. The power amplification system according to claim 1, wherein the biasing circuit is configured to bias the PA with a quiescent bias that causes the PA to operate in class-AB.

5. A power amplification system, comprising:
   a Power Amplifier (PA), configured to amplify an input Radio Frequency (RF) signal; and
   an adaptive bias circuit configured to adaptively set a bias of the PA, the adaptive biasing circuit comprising:
      a gain expansion circuit, configured to derive a gain-expansion control signal from the input RF signal, wherein, for a first sub-range of power levels of the input RF signal, the gain-expansion control signal has a larger dynamic range than the input RF signal;
      a gain compression circuit, configured to derive a gain-compression control signal from the input RF signal, wherein, for a second sub-range of power levels of the input RF signal having higher power levels than the first sub-range, the gain-compression control signal has a smaller dynamic range than the input RF signal;
      a biasing circuit, configured to set the bias of the PA responsively to the gain-expansion control signal and the gain-compression control signal; and
   an output balanced-to-unbalanced (BALUN) transformer for coupling an output of the PA to a load, wherein the BALUN transformer is configurable to operate in a first mode having a first coupling ratio, and in a second mode having a second coupling ratio higher than the first coupling ratio.

6. The power amplification system according to claim 5, further comprising a controller that is configured to set the BALUN transformer to the first mode for a first output power setting of the PA, and to the second mode for a second output power setting of the PA, higher than the first output power setting.

7. The power amplification system according to claim 1, wherein the adaptive bias circuit is configured to set the bias of the PA in open-loop, irrespective of an output of the PA.

8. A power amplification method, comprising:
   amplifying an input Radio Frequency (RF) signal using a differential Power Amplifier (PA); and
   adaptively setting a bias of the PA, by:
      deriving a gain-expansion control signal from the input RF signal, wherein, for a first sub-range of power levels of the input RF signal, the gain-expansion control signal has a larger dynamic range than the input RF signal;
      deriving a gain-compression control signal from the input RF signal, wherein, for a second sub-range of power levels of the input RF signal having higher power levels than the first sub-range, the gain-compression control signal has a smaller dynamic range than the input RF signal; and
      setting the bias of the PA responsively to the gain-expansion control signal and the gain-compression control signal, by setting a common-mode level for the input RF signal.

9. The power amplification method according to claim 8, wherein setting the bias of the PA comprises summing the gain-expansion control signal and the gain-compression control signal, and setting the bias of the PA responsively to the sum.

10. The power amplification method according to claim 8, wherein deriving the gain-expansion control signal and the gain-compression control signal comprises applying respective trans-conductance amplifiers to the input RF signal.

11. The power amplification method according to claim 8, wherein deriving the gain-expansion control signal comprises applying a P-type metal-oxide-semiconductor (PMOS) based amplifier to the input RF signal, and wherein deriving the gain-compression control signal comprises applying an N-type metal-oxide-semiconductor (NMOS) based amplifier to the input RF signal.

12. The power amplification method according to claim 8, wherein setting the bias of the PA comprises biasing the PA with a quiescent bias that causes the PA to operate in class-AB.

13. The power amplification method according to claim 8, further comprising operating an output balanced-to-unbalanced (BALUN) transformer, which couples an output of the PA to a load, in a first mode having a first coupling ratio, and in a second mode having a second coupling ratio higher than the first coupling ratio.

14. The power amplification method according to claim 13, wherein operating the BALUN transformer comprises setting the BALUN transformer to the first mode for a first output power setting of the PA, and to the second mode for a second output power setting of the PA, higher than the first output power setting.

15. The power amplification method according to claim 8, wherein setting the bias of the PA is performed in open-loop, irrespective of an output of the PA.

16. A power amplification system, comprising:
   a Power Amplifier (PA), configured to amplify an input Radio Frequency (RF) signal; and
   an adaptive bias circuit configured to adaptively set a bias of the PA, the adaptive biasing circuit comprising:

a gain expansion circuit, comprising a P-type metal-oxide-semiconductor (PMOS) based amplifier configured to amplify the input RF signal so as to output a gain-expansion control signal, wherein, for a first sub-range of power levels of the input RF signal, the gain-expansion control signal has a larger dynamic range than the input RF signal;

a gain compression circuit, comprising an N-type metal-oxide-semiconductor (NMOS) based amplifier configured to amplify the input RF signal so as to output a gain-compression control signal, wherein, for a second sub-range of power levels of the input RF signal having higher power levels than the first sub-range, the gain-compression control signal has a smaller dynamic range than the input RF signal; and a biasing circuit, configured to set the bias of the PA responsively to the gain-expansion control signal and the gain-compression control signal.

* * * * *